United States Patent
Wang et al.

(10) Patent No.: US 10,868,251 B2
(45) Date of Patent: Dec. 15, 2020

(54) METHOD FOR FABRICATING ORGANIC LIGHT EMITTING DIODE DISPLAY

(71) Applicant: WUHAN CHINA STAR OPTOELECTRONICS SEMICONDUCTOR DISPLAY TECHNOLOGY CO., LTD., Hubei (CN)

(72) Inventors: Jing Wang, Hubei (CN); San Zhu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/468,678

(22) PCT Filed: Nov. 6, 2018

(86) PCT No.: PCT/CN2018/114039
§ 371 (c)(1),
(2) Date: Jun. 12, 2019

(87) PCT Pub. No.: WO2020/047989
PCT Pub. Date: Mar. 12, 2020

(65) Prior Publication Data
US 2020/0227638 A1    Jul. 16, 2020

(30) Foreign Application Priority Data
Sep. 4, 2018  (CN) .......................... 2018 1 1022254

(51) Int. Cl.
*H01L 29/08*    (2006.01)
*H01L 33/00*    (2010.01)
(Continued)

(52) U.S. Cl.
CPC ...... *H01L 51/0002* (2013.01); *H01L 27/3262* (2013.01); *H01L 51/5256* (2013.01); *H01L 51/56* (2013.01); *H01L 2251/53* (2013.01)

(58) Field of Classification Search
CPC . H01L 51/0002; H01L 51/5256; H01L 51/56; H01L 51/5253; H01L 27/3262
See application file for complete search history.

(56) References Cited

U.S. PATENT DOCUMENTS

2012/0193816 A1* 8/2012 Schmid ................. H01L 51/448
257/787
2013/0207093 A1* 8/2013 Jeong ................... H01L 51/5243
257/40
(Continued)

FOREIGN PATENT DOCUMENTS

| CN | 1617635 A | 5/2005 |
|----|-----------|--------|
| CN | 103828074 A | 5/2014 |

(Continued)

*Primary Examiner* — Alonzo Chambliss
(74) *Attorney, Agent, or Firm* — Mark M. Friedman

(57) ABSTRACT

A method for fabricating an organic light emitting diode (OLED) display is provided. The fabricating method includes: forming a switch array layer on a base substrate; forming an organic light emitting display layer on the switch array layer; forming a thin film package layer on the organic light emitting display layer; and forming a superhydrophobic thin film on the thin film package layer using plasma chemical vapor deposition. The superhydrophobic thin film has a thickness smaller than a predetermined thickness.

12 Claims, 1 Drawing Sheet

(51) Int. Cl.
*H01L 31/0203* (2014.01)
*H01L 21/00* (2006.01)
*H01L 51/40* (2006.01)
*H01L 51/00* (2006.01)
*H01L 51/52* (2006.01)
*H01L 51/56* (2006.01)
*H01L 27/32* (2006.01)

(56) References Cited

U.S. PATENT DOCUMENTS

| | | | |
|---|---|---|---|
| 2014/0291658 A1 | 10/2014 | Müller | |
| 2015/0171369 A1* | 6/2015 | Xie | H01L 51/5253 257/40 |
| 2015/0357480 A1* | 12/2015 | Yu | H01L 21/02565 257/43 |
| 2016/0064689 A1 | 3/2016 | Xie | |
| 2018/0241003 A1 | 8/2018 | Huang | |
| 2018/0294435 A1 | 10/2018 | Jin | |

FOREIGN PATENT DOCUMENTS

| | | |
|---|---|---|
| CN | 103956373 A | 7/2014 |
| CN | 104300091 A | 1/2015 |
| CN | 106450031 A | 2/2017 |
| CN | 106784365 A | 5/2017 |
| KR | 20110139892 A | 12/2011 |

\* cited by examiner

METHOD FOR FABRICATING ORGANIC LIGHT EMITTING DIODE DISPLAY

CROSS REFERENCE TO RELATED APPLICATIONS

This application claims the priority of International Application No. PCT/CN2018/114039, filed on Nov. 6, 2018, which claims priority to Chinese Application No. 201811022254.8, filed on Sep. 4, 2018. The entire disclosures of the above applications are incorporated herein by reference.

FIELD OF INVENTION

The present disclosure relates to a technical field of displays, and more particularly to a method for fabricating an organic light emitting diode (OLED) display.

BACKGROUND OF INVENTION

Because organic light emitting polymers in organic light emitting diodes (OLEDs) are easily corroded by oxygen and water, which cause oxidation reactions of organic light emitting polymers, efficiency and lifes of OLED devices are decreased. In order to prevent OLED light emitting layers from being invaded by water and oxygen, prolong service lifes of OLEDs, and increase luminous efficiency of OLEDs, currently, sandwich form package structures, i.e. inorganic-organic-inorganic form package structures, are commonly used in industry. In order to ensure strong compactness to block water and oxygen, surfaces of inorganic layers usually do not have good hydrophobicity.

A current superhydrophobic thin film is formed using perfluorosilane, methyl nonafluorobutyl ether, ethyl perfluorobutyl ether, acetone, or the like, as a diluent or raw material, then using molecules containing a trihydroxysilyl reactive group as a silicon reagent, such as perfluorodecyltrimethoxysilane, perfluorooctyltrimethoxysilane, or octadecyltrimethoxysilane, then using a sol-gel method to form mixed matrix material, and then spraying, printing, or similarly applying the mixed matrix material on a surface of a glass substrate. However, a thickness of sprayed or inkjet printed coating is thick, wherein the thickness is controlled to be between 4-12 um using a current industry inkjet printing technology, and a thickness of an inorganic package layer is usually only 1 um. Spraying cannot ensure uniformity, which may easily cause mura, or other defects. The superhydrophobic thin film formed using any of these methods has a small water droplet contact angle (about 35 degrees), causing a polarizer laminating process, a protective film laminating process, or the like, difficult to achieve effective lamination of laminated material.

Therefore, it is desired to provide a method for fabricating an OLED display to solve the existing problems in the related art.

SUMMARY OF INVENTION

An object of the present disclosure is to provide a method for fabricating an organic light emitting diode (OLED) display that may improve uniformity of thicknesses, compactness, and surface lamination performance of a thin film, and is less prone to mura.

In order to solve the aforementioned problem, the present disclosure provides a method for fabricating an OLED display including:

forming a switch array layer on a base substrate;
forming an organic light emitting display layer on the switch array layer;
forming a thin film package layer on the organic light emitting display layer; and
forming a superhydrophobic thin film on the thin film package layer using plasma chemical vapor deposition;
wherein the superhydrophobic thin film has a thickness smaller than a predetermined thickness; and
wherein material of the superhydrophobic thin film includes trimethylmethoxysilane, octamethylcyclotetrasiloxane, tetrafluoroethane, TMS($CH_3$)4Si, FAS-17($CF_3$($CF_2$)7$CH_2CH_2Si(OCH_3)_3$), or hexamethyldisilazane.

In the method for fabricating the OLED display in accordance with the present disclosure, when the material of the superhydrophobic thin film is the trimethylmethoxysilane, the superhydrophobic thin film is formed using microwave plasma chemical vapor deposition.

In the method for fabricating the OLED display in accordance with the present disclosure, the step of forming the superhydrophobic thin film on the thin film package layer using the plasma chemical vapor deposition includes:

correspondingly maintaining pressure of the trimethylmethoxysilane and pressure of working gas of a processing chamber to be at predetermined values; and breaking down the trimethylmethoxysilane into plasma, causing the plasma to react in the processing chamber, and depositing the reacted plasma on the thin film package layer, to form the superhydrophobic thin film, wherein the working gas is argon.

In the method for fabricating the OLED display in accordance with the present disclosure, when the material of the superhydrophobic thin film is the TMS($CH_3$)4Si or the FAS-17($CF_3$($CF_2$)7$CH_2CH_2Si(OCH_3)_3$), the superhydrophobic thin film is formed using low pressure plasma chemical vapor deposition.

In the method for fabricating the OLED display in accordance with the present disclosure, when the material of the superhydrophobic thin film is the tetrafluoroethane, the superhydrophobic thin film is formed using radio frequency pulsed low pressure plasma chemical vapor deposition.

In the method for fabricating the OLED display in accordance with the present disclosure, when the material of the superhydrophobic thin film is the octamethylcyclotetrasiloxane, the step of forming the superhydrophobic thin film on the thin film package layer using the plasma chemical vapor deposition includes:

plasma treating the octamethylcyclotetrasiloxane with oxygen so that the octamethylcyclotetrasiloxane is surface-hydrophilized; and depositing the plasma-treated octamethylcyclotetrasiloxane on the thin film package layer, to obtain the superhydrophobic thin film.

In the method for fabricating the OLED display in accordance with the present disclosure, when the material of the superhydrophobic thin film is hexamethyldisilazane, the superhydrophobic thin film is formed using atmospheric pressure plasma chemical vapor deposition.

In the method for fabricating the OLED display in accordance with the present disclosure, a surface of the superhydrophobic thin film has a water droplet contact angle of more than 160 degrees.

In the method for fabricating the OLED display in accordance with the present disclosure, the thickness of the superhydrophobic thin film is smaller than 4 um.

In order to solve the aforementioned problem, the present disclosure provides a method for fabricating an OLED display including:

forming a switch array layer on a base substrate;

forming an organic light emitting display layer on the switch array layer;

forming a thin film package layer on the organic light emitting display layer; and forming a superhydrophobic thin film on the thin film package layer using plasma chemical vapor deposition, wherein the superhydrophobic thin film has a thickness smaller than a predetermined thickness.

In the method for fabricating the OLED display in accordance with the present disclosure, the superhydrophobic thin film includes a carbon nanotube thin film, a zinc oxide nanorod-structured thin film, or a silicon oxide nano thin film.

In the method for fabricating the OLED display in accordance with the present disclosure, material of the superhydrophobic thin film includes trimethylmethoxysilane, octamethylcyclotetrasiloxane, tetrafluoroethane, $TMS(CH_3)4Si$, $FAS-17(CF_3(CF_2)7CH_2CH_2Si(OCH_3)_3)$, or hexamethyldisilazane.

In the method for fabricating the OLED display in accordance with the present disclosure, when the material of the superhydrophobic thin film is the trimethylmethoxysilane, the superhydrophobic thin film is formed using microwave plasma chemical vapor deposition.

In the method for fabricating the OLED display in accordance with the present disclosure, the step of forming the superhydrophobic thin film on the thin film package layer using the plasma chemical vapor deposition includes:

correspondingly maintaining pressure of the trimethylmethoxysilane and pressure of working gas of a processing chamber to be at predetermined values; and breaking down the trimethylmethoxysilane into plasma, causing the plasma to react in the processing chamber, and depositing the reacted plasma on the thin film package layer, to form the superhydrophobic thin film, wherein the working gas is argon.

In the method for fabricating the OLED display in accordance with the present disclosure, when the material of the superhydrophobic thin film is the $TMS(CH_3)4Si$ or the $FAS-17(CF_3(CF_2)7CH_2CH_2Si(OCH_3)_3)$, the superhydrophobic thin film is formed using low pressure plasma chemical vapor deposition.

In the method for fabricating the OLED display in accordance with the present disclosure, when the material of the superhydrophobic thin film is the tetrafluoroethane, the superhydrophobic thin film is formed using radio frequency pulsed low pressure plasma chemical vapor deposition.

In the method for fabricating the OLED display in accordance with the present disclosure, when the material of the superhydrophobic thin film is the octamethylcyclotetrasiloxane, the step of forming the superhydrophobic thin film on the thin film package layer using the plasma chemical vapor deposition includes:

plasma treating the octamethylcyclotetrasiloxane with oxygen so that the octamethylcyclotetrasiloxane is surface-hydrophilized; and depositing the plasma-treated octamethylcyclotetrasiloxane on the thin film package layer, to obtain the superhydrophobic thin film.

In the method for fabricating the OLED display in accordance with the present disclosure, when the material of the superhydrophobic thin film is hexamethyldisilazane, the superhydrophobic thin film is formed using atmospheric pressure plasma chemical vapor deposition.

In the method for fabricating the OLED display in accordance with the present disclosure, a surface of the superhydrophobic thin film has a water droplet contact angle of more than 160 degrees.

In the method for fabricating the OLED display in accordance with the present disclosure, the thickness of the superhydrophobic thin film is smaller than 4 um.

In the method for fabricating the OLED display in accordance with the present disclosure, the superhydrophobic thin film is formed using the plasma chemical vapor deposition. Therefore, the method may improve uniformity of thicknesses, compactness, and surface lamination performance of the thin film, and is less prone to mura.

DETAILED DESCRIPTION OF PREFERRED EMBODIMENTS

Figure 1:
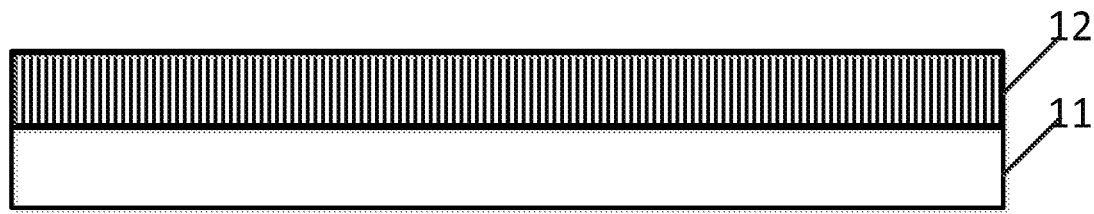
FIG. 1 is a schematic structural diagram of a first step of a method for fabricating an organic light emitting diode (OLED) display in accordance with the present disclosure.

The description of each embodiment below refers to respective accompanying drawing(s), so as to illustrate exemplarily specific embodiments of the present disclosure that may be practiced. Directional terms mentioned in the present disclosure, such as "upper", "lower", "front", "back", "left", "right", "inner", "outer", "side", etc., are only directions by referring to the accompanying drawings, and thus the used directional terms are used to describe and understand the present disclosure, but the present disclosure is not limited thereto. In the drawings, structurally similar units are labeled by the same reference numerals.

Referring to FIGS. 1 to 4, FIG. 1 is a schematic structural diagram of a first step of a method for fabricating an organic light emitting diode (OLED) display in accordance with the present disclosure.

As illustrated in FIGS. 1 to 4, the method for fabricating the OLED display in accordance with the present disclosure mainly includes the following steps.

In step S101, a switch array layer is formed on a base substrate.

For example, as illustrated in FIG. 1, the switch array layer 12 is formed on the base substrate 11. A cross-sectional structure of the switch array layer 12 includes a channel, a gate, and a source and a drain. The switch array layer 12 has a plurality of thin film transistors. Material of the base substrate 11 is polyimide (PI).

In step S102, an organic light emitting display layer is formed on the switch array layer.

Figure 2:
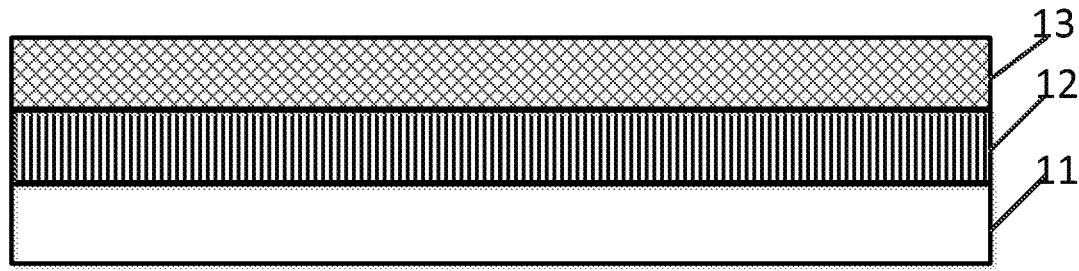
FIG. 2 is a schematic structural diagram of a second step of the method for fabricating the OLED display in accordance with the present disclosure.

For example, as illustrated in FIG. 2, the organic light emitting display layer 13 is formed on the switch array layer 12. A cross-sectional structure of the organic light emitting display layer 13 includes an anode, a light emitting layer, and a cathode. The organic light emitting display layer 13 has a plurality of organic light emitting units.

In step S103, a thin film package layer is formed on the organic light emitting display layer.

Figure 3:
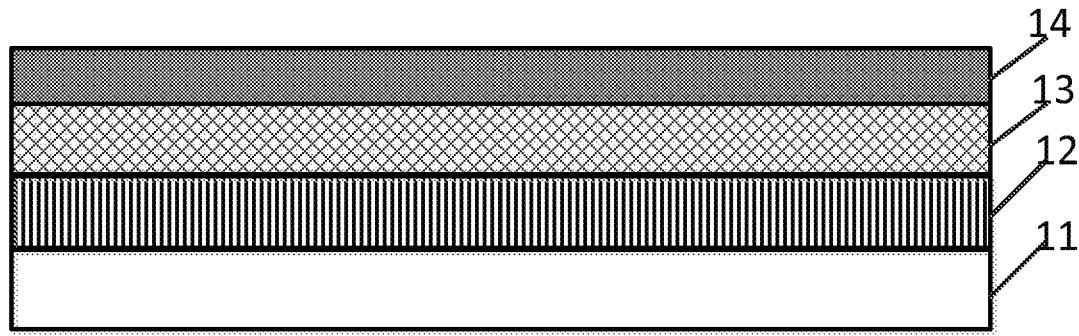
FIG. 3 is a schematic structural diagram of a third step of the method for fabricating the OLED display in accordance with the present disclosure.

For example, as illustrated in FIG. 3, the thin film package layer 14 is formed on the organic light emitting display layer 13. A cross-sectional structure of the thin film package layer 14 is a multi-layer structure including, for example, a first inorganic layer, a first organic layer, and a second inorganic layer. In addition, the multi-layer structure may further include a second organic layer on the second inorganic layer. Material of the above inorganic layers may be at least one of silicon oxide, silicon nitride, and silicon oxynitride. Material of the above organic layers include acrylic, epoxy resin, and acrylic organic material or atomic monomer material.

In step S104, a superhydrophobic thin film is formed on the thin film package layer using plasma chemical vapor deposition. The superhydrophobic thin film has a thickness smaller than a predetermined thickness.

Figure 4:
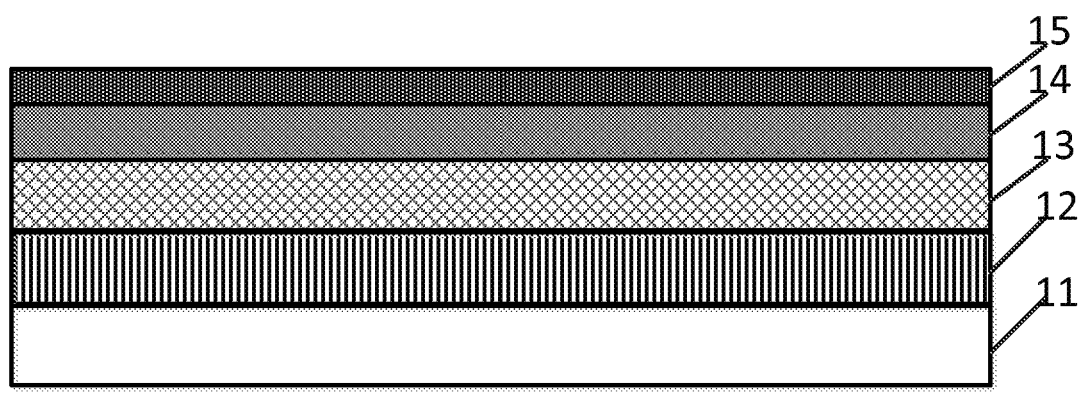
FIG. 4 is a schematic structural diagram of a fourth step of the method for fabricating the OLED display in accordance with the present disclosure.

For example, as illustrated in FIG. 4, the superhydrophobic thin film 15 is formed on the thin film package layer 14 using the plasma chemical vapor deposition. The superhydrophobic thin film 15 has the thickness smaller than the predetermined thickness (nanoscale). For example, the thickness of the superhydrophobic thin film 15 is smaller than 4 um. The predetermined thickness is a thickness of a superhydrophobic thin film formed using spraying or inkjet printing. A surface of the superhydrophobic thin film 15 has a water droplet contact angle of more than 160 degrees, thereby improving surface lamination performance of the display.

The superhydrophobic thin film includes an inorganic matrix superhydrophobic thin film such as a carbon nanotube thin film, a zinc oxide nanorod-structured thin film, or a silicon oxide nano thin film; or an organic monomer superhydrophobic thin film formed using a monomer(s) such as trimethylmethoxysilane, octamethylcyclotetrasiloxane, tetrafluoroethane, $TMS(CH_3)4Si$ and $FAS-17(CF_3(CF_2)7CH_2CH_2Si(OCH_3)_3)$, or hexamethyldisilazane.

For example, when the uppermost layer of the thin film package layer 14 is an inorganic layer, the superhydrophobic thin film 15 includes the carbon nanotube thin film, the zinc oxide nanorod-structured thin film, or the silicon oxide nano thin film.

Taking the carbon nanotube thin film as the superhydrophobic thin film 15 as an example, the carbon nanotube superhydrophobic thin film is formed by a plasma chemical vapor deposition apparatus. The plasma chemical vapor deposition apparatus has a working chamber (processing chamber), a system power supply, and a radio frequency (RF) power supply. The plasma chemical vapor deposition apparatus may include a heating module and a cooling module.

The OLED display with the thin film package layer thereon is placed into the working chamber, wherein working gas of the working chamber is $H_2$, and reaction gas is $CH_4$. Cooling water and the system power supply are turned on. The working chamber is pumped such that pressure of the working chamber is below 10 Pa. A flow ratio of $H_2$ and $CH_4$ is controlled. A heating system is turned on and begins heating. The RF power supply is turned on to adjust power and adjust deposition pressure in a vacuum chamber such that the reaction gas is ignited, and carbon nanotubes begin to grow. Processing time is set based on parameters and processing requirements. After 5-30 minutes, growth of the carbon nanotube thin film is finished.

For example, when the uppermost layer of the thin film package layer 14 is an organic layer, material of the superhydrophobic thin film 15 includes trimethylmethoxysilane, octamethylcyclotetrasiloxane, tetrafluoroethane, $TMS(CH_3)4Si$, $FAS-17(CF_3(CF_2)7CH_2CH_2Si(OCH_3)_3)$, or hexamethyldisilazane.

When the material of the superhydrophobic thin film 15 is the $TMS(CH_3)4Si$ or the $FAS-17(CF_3(CF_2)7CH_2CH_2Si(OCH_3)_3)$, the superhydrophobic thin film is formed using low pressure plasma chemical vapor deposition.

A specific processing process is as follows. Argon is used as working gas, and a microwave high-voltage power supply is used as an excitation source. Under protection of argon, a precursor monomer of $TMS(CH_3)4Si$ or $FAS-17(CF_3(CF_2)7CH_2CH_2Si(OCH_3)_3)$ is broken down so that an even low temperature plasma is generated. The plasma reacts chemically in a vacuum-like chamber, and is then plated on the thin film package layer, so that the superhydrophobic thin film which is even is obtained.

When the material of the superhydrophobic thin film 15 is the tetrafluoroethane, the superhydrophobic thin film 15 is formed using radio frequency pulsed low pressure plasma chemical vapor deposition. The superhydrophobic thin film which is high quality may be formed using an RF power supply of which a pulse sequence is set as 10/100 ms.

When the material of the superhydrophobic thin film 15 is the trimethylmethoxysilane, the superhydrophobic thin film 15 is formed using microwave plasma chemical vapor deposition. The step of forming the superhydrophobic thin film on the thin film package layer using the plasma chemical vapor deposition includes:

correspondingly maintaining pressure of the trimethylmethoxysilane and pressure of working gas of a processing chamber to be at predetermined values; and breaking down the trimethylmethoxysilane monomer into plasma, causing the plasma to react in the processing chamber; and depositing the reacted plasma on the thin film package layer, to form the superhydrophobic thin film 15, wherein the working gas is argon.

For example, the trimethylmethoxysilane is used as the monomer, and argon is used as the working gas. The pressure of the monomer and the working gas are correspondingly maintained at 35 Pa and 60 Pa. The monomer is broken down into the plasma, reacts in the processing chamber, and is deposited on the thin film package layer 14, so that the superhydrophobic thin film is formed.

When the material of the superhydrophobic thin film 15 is the octamethylcyclotetrasiloxane, the superhydrophobic thin film is formed using the plasma chemical vapor deposition. The step of forming the superhydrophobic thin film on the thin film package layer using the plasma chemical vapor deposition includes:

plasma treating the octamethylcyclotetrasiloxane with oxygen so that the octamethylcyclotetrasiloxane is surface-hydrophilized; and depositing the plasma-treated octamethylcyclotetrasiloxane on the thin film package layer, to obtain the superhydrophobic thin film.

For example, the octamethylcyclotetrasiloxane is used as the monomer, and the oxygen is used as the working gas. Plasma treating the monomer with oxygen so that the monomer is surface-hydrophilized, and the processed monomer is caused to be deposited on the thin film package layer, so that the superhydrophobic thin film 15 is formed.

When the material of the superhydrophobic thin film is hexamethyldisilazane, the superhydrophobic thin film is formed using atmospheric pressure plasma chemical vapor deposition.

For example, argon is used as working gas. A hexamethyldisilazane monomer is obtained using foaming. An RF power supply of 13.56 MHz is used as an excitation source. Deposition caused by reactions in a processing chamber may result in excellent hydrophobicity. The formation method may also use helium and nitrogen as working gas to generate plasma.

In the method for fabricating the OLED display in accordance with the present disclosure, because the superhydrophobic thin film is formed on the thin film package layer using the plasma chemical vapor deposition, waterproof effect of the thin film package layer of an organic light emitting device is enhanced, and a service life of the device is prolonged. In addition, non-uniform thickness, poor compactness, and a mura problem of a thin film are prevented, and the superhydrophobic thin film which has good compactness, even thickness, and good surface lamination performance is obtained. Furthermore, the processing method in accordance with the present disclosure may directly use the plasma chemical vapor deposition apparatus for forming the inorganic layer, and therefore does not need an apparatus that is additionally purchased, thereby saving a cost. Also, a thickness of the superhydrophobic thin film is smaller, and hence a film formation speed is fast, and repeatability is high.

In the method for fabricating the OLED display in accordance with the present disclosure, the superhydrophobic thin film is formed using the plasma chemical vapor deposition. Therefore, the method may improve uniformity of thicknesses, compactness, and surface lamination performance of the thin film, and is less prone to mura.

In summary, although the present disclosure has been described with preferred embodiments thereof above, it is not intended to be limited by the foregoing preferred embodiments. Persons skilled in the art can carry out many changes and modifications to the described embodiments without departing from the scope and the spirit of the present disclosure. Therefore, the protection scope of the present disclosure is in accordance with the scope defined by the claims.

What is claimed is:

1. A method for fabricating an organic light emitting diode (OLED) display, comprising:
    forming a switch array layer on a base substrate;
    forming an organic light emitting display layer on the switch array layer;
    forming a thin film package layer on the organic light emitting display layer; and
    forming a superhydrophobic thin film on the thin film package layer using plasma chemical vapor deposition; and
    wherein material of the superhydrophobic thin film comprises trimethylmethoxysilane, octamethylcyclotetrasiloxane, tetrafluoroethane, TMS($CH_3$)4Si, FAS-17($CF_3$($CF_2$)7$CH_2CH_2Si(OCH_3)_3$), or hexamethyldisilazane.

2. The method for fabricating the OLED display of claim 1, wherein
    when the material of the superhydrophobic thin film is the trimethylmethoxysilane, the superhydrophobic thin film is formed using microwave plasma chemical vapor deposition.

3. The method for fabricating the OLED display of claim 2, wherein the step of forming the superhydrophobic thin film on the thin film package layer using the plasma chemical vapor deposition comprises:
    correspondingly maintaining pressure of the trimethylmethoxysilane and pressure of working gas of a processing chamber to be at predetermined values; and
    breaking down the trimethylmethoxysilane into plasma, causing the plasma to react in the processing chamber, and depositing the reacted plasma on the thin film package layer, to form the superhydrophobic thin film, wherein the working gas is argon.

4. The method for fabricating the OLED display of claim 1, wherein
    when the material of the superhydrophobic thin film is the TMS($CH_3$)4Si or the FAS-17($CF_3$($CF_2$)7$CH_2CH_2Si(OCH_3)_3$), the superhydrophobic thin film is formed using low pressure plasma chemical vapor deposition.

5. The method for fabricating the OLED display of claim 1, wherein
    when the material of the superhydrophobic thin film is the tetrafluoroethane, the superhydrophobic thin film is formed using radio frequency pulsed low pressure plasma chemical vapor deposition.

6. The method for fabricating the OLED display of claim 1, wherein when the material of the superhydrophobic thin film is the octamethylcyclotetrasiloxane, the step of forming the superhydrophobic thin film on the thin film package layer using the plasma chemical vapor deposition comprises:
    plasma treating the octamethylcyclotetrasiloxane with oxygen so that the octamethylcyclotetrasiloxane is surface-hydrophilized; and
    depositing the plasma-treated octamethylcyclotetrasiloxane on the thin film package layer, to obtain the superhydrophobic thin film.

7. The method for fabricating the OLED display of claim 1, wherein
    when the material of the superhydrophobic thin film is hexamethyldisilazane, the superhydrophobic thin film is formed using atmospheric pressure plasma chemical vapor deposition.

8. The method for fabricating the OLED display of claim 1, wherein a surface of the superhydrophobic thin film has a water droplet contact angle of more than 160 degrees.

9. The method for fabricating the OLED display of claim 1, wherein the thickness of the superhydrophobic thin film is smaller than 4 um.

10. A method for fabricating an organic light emitting diode (OLED) display, comprising:
    forming a switch array layer on a base substrate;
    forming an organic light emitting display layer on the switch array layer;
    forming a thin film package layer on the organic light emitting display layer; and
    forming a superhydrophobic thin film on the thin film package layer using plasma chemical vapor deposition; and
    wherein the superhydrophobic thin film comprises a carbon nanotube thin film, a zinc oxide nanorod-structured thin film, or a silicon oxide nano thin film.

11. The method for fabricating the OLED display of claim 10, wherein a surface of the superhydrophobic thin film has a water droplet contact angle of more than 160 degrees.

12. The method for fabricating the OLED display of claim 10, wherein the thickness of the superhydrophobic thin film is smaller than 4 um.

* * * * *